US008637774B2

(12) United States Patent
Hiner et al.

(10) Patent No.: US 8,637,774 B2
(45) Date of Patent: Jan. 28, 2014

(54) TRACER WIRE CONNECTOR KITS

(75) Inventors: William Hiner, O'Fallon, MO (US); Lloyd Herbert King, Jr., Chesterfield, MO (US); James C. Keeven, O'Fallon, MO (US)

(73) Assignee: The Patent Store LLC, O'Fallon, MO (US)

( * ) Notice: Subject to any disclaimer, the term of this patent is extended or adjusted under 35 U.S.C. 154(b) by 111 days.

(21) Appl. No.: 12/932,090

(22) Filed: Feb. 17, 2011

(65) Prior Publication Data

US 2011/0143568 A1 Jun. 16, 2011

Related U.S. Application Data

(62) Division of application No. 12/080,351, filed on Apr. 2, 2008, now Pat. No. 7,950,956.

(60) Provisional application No. 60/923,096, filed on Apr. 12, 2007.

(51) Int. Cl.

| | |
|---|---|
| ***H01R 4/70*** | (2006.01) |
| *H02G 15/02* | (2006.01) |
| *H01R 4/00* | (2006.01) |
| *H02G 3/06* | (2006.01) |
| *H02G 15/08* | (2006.01) |
| *H01R 13/46* | (2006.01) |
| *H02G 3/18* | (2006.01) |
| *H01L 23/48* | (2006.01) |
| *H01R 13/52* | (2006.01) |

(52) U.S. Cl.
USPC .......... 174/138 F; 174/75 D; 174/92; 174/60; 174/527; 174/75 R; 439/521

(58) Field of Classification Search
USPC ............ 174/76, 92, 80, 74 R, 75 R, 75 D, 79, 174/74 A, 138 F, 169, 176, 177, 178, 489, 174/527, 60; 339/116 R, 116 C; 439/521
See application file for complete search history.

(56) References Cited

U.S. PATENT DOCUMENTS

| | | | | |
|---|---|---|---|---|
| 3,715,459 | A * | 2/1973 | Hoffman | 174/138 F |
| 4,085,286 | A * | 4/1978 | Horsma et al. | 174/92 |
| 4,176,245 | A * | 11/1979 | Merlack et al. | 174/92 |
| 4,451,696 | A * | 5/1984 | Beinhaur | 174/92 |
| 4,610,738 | A * | 9/1986 | Jervis | 156/49 |
| 5,116,654 | A * | 5/1992 | Cosman et al. | 428/77 |
| 5,561,269 | A * | 10/1996 | Robertson et al. | 174/92 |
| 5,594,210 | A * | 1/1997 | Yabe | 174/76 |
| 5,763,835 | A * | 6/1998 | Huynh-Ba et al. | 174/92 |
| 5,828,005 | A * | 10/1998 | Huynh-Ba et al. | 174/92 |
| 6,265,665 | B1 * | 7/2001 | Zahnen | 174/92 |
| 6,544,070 | B1 * | 4/2003 | Radliff | 439/596 |
| 7,017,266 | B1 * | 3/2006 | Tanner | 29/857 |
| 7,109,416 | B1 * | 9/2006 | Reed | 174/50 |
| 2007/0240893 | A1 * | 10/2007 | Bremnes et al. | 174/36 |

* cited by examiner

*Primary Examiner* — Hoa C Nguyen
*Assistant Examiner* — Binh Tran
(74) *Attorney, Agent, or Firm* — Jacobson & Johnson LLC

(57) ABSTRACT

A ready to use tracer wire connector kit comprising a pod and cover that can be mated together around a tracer wire connector that can be retained in the pod or removed from the pod as the tracer wires are joined therein with the pod and cover encapsulating and protecting the junction of tracer wires in the tracer wire connector and a method and system wherein underground difficult to detect devices and systems can be indirectly located.

7 Claims, 5 Drawing Sheets

TRACER WIRE CONNECTOR KITS

CROSS REFERENCE TO RELATED APPLICATIONS

This application is a divisional application of Ser. No. 12/080,351 filed Apr. 2, 2008 entitled Tracer Wire Connector Kits (pending), which claims priority from provisional application titled Tracer Wire Connector Ser. No. 60/923,096 filed Apr. 13, 2007.

FIELD OF THE INVENTION

This invention relates generally to tracer wire systems and, more specifically, to tracer wire connector kits and method of connecting tracer wires.

STATEMENT REGARDING FEDERALLY SPONSORED RESEARCH OR DEVELOPMENT

None

REFERENCE TO A MICROFICHE APPENDIX

None

BACKGROUND OF THE INVENTION

Tracer wires are used in systems where underground objects such as plastic pipes, which are non-electrical conductors, need to be located at a later date. Since non-electrical conductors are difficult to detect from above ground an electrical conductor such as a metal tracer wire is laid alongside the underground plastic pipe. By knowing the existence of the tracer wire proximate the underground pipe allows one to locate the pipe by passing electrical current through the tracer wire and sensing the electrical field with an above ground detector. Tracer wire connectors useable in such underground tracer wire systems are shown and described in U.S. Pat. No. 7,179,114.

SUMMARY OF THE INVENTION

A tracer wire connector kit comprising a pod shell formed from pods with at least one pod having a chamber for containing a sealant and a tracer wire channel extending into the chamber. The kit may further include a tracer wire connector which may be used to join tracer wires which are located outside the pod shell. A feature of the invention is when the tracer wires are joined by the tracer wire connector they form a tracer wire junction to enable the tracer wire connector and the tracer wire junction to be encapsulated with a sealant by bringing the pods into mating engagement to form a pod shell about the tracer wire connector. A feature of the invention may include a shoulder which is placed in the pod to coact with the tracer wire connector to inhibit accidental displacement of the tracer wire junction by restraining axial movement of the tracer wire connector. A feature of the invention is that a living hinge may be used to hold the pods proximate each other and to align the pods so they may be quickly folded about the tracer wire connector to form a protective pod shell. A feature of the invention is that the tracer wire connector may be removed or retained in the pod when the tracer wire connector is used to join the tracer wires as well as an underground system and method of making an underground system that is normally difficult to detect from above ground by connecting tracer wires together along the underground system.

DESCRIPTION OF THE PREFERRED EMBODIMENT

Figure 1:
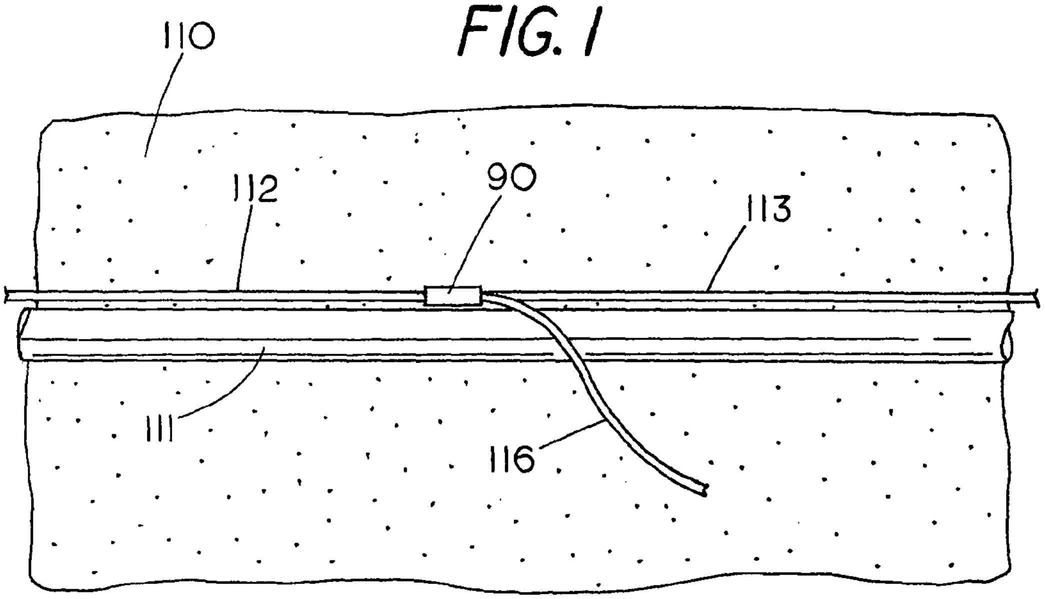
FIG. 1 is a side view of an underground pipe having a tracer wire proximate thereto and a tracer wire connector kit securing a main tracer wire to a branch tracer wire.

FIG. 1 is a side sectional view showing an underground pipe 111 located in a layer of soil 110. Pipe 111 is a polymer plastic pipe or the like that is difficult to detect from above ground with conventional detectors since there is generally no metal or electrical current that flows through the pipe. In order to provide for ease in post burial location of underground pipe 111 metal tracer wires 112 and 113 have been extended along pipe 111 since the presence of a metal wire or an electrical current in the metal wire is easy to detect with above ground conventional detectors. By identifying the location of the tracer wire from above ground one can determine the location of the underground pipe 111 since the tracer wire is located proximate the underground pipe. In some instance a branch pipe (not shown) may be connected to the pipe 111 and a branch tracer wire 116 would be connected to follow the branch pipe so that the branch pipe could also be located by the presence of a tracer wire. Tracer wires 112, 113 and 116 are connected to each other through a tracer wire connector kit 90. In the embodiment shown the tracer wire connector kit 90 includes a single passage on one end for tracer wire 112 and two passages on the opposite end, namely, a passage for tracer wire 113 and a passage for tracer wire 116. An example of such a tracer wire connector kit 90 is shown in greater detail in FIG. 4, FIG. 5, FIG. 6 and FIG. 6A.

Figure 2:
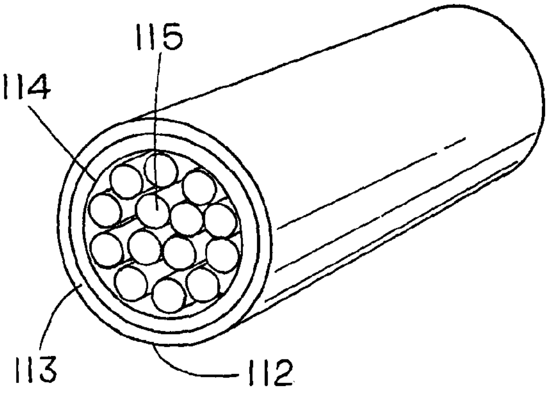
FIG. 2 is an end view of a tracer wire having a multiple strand steel core with an annular copper conductor on the core and an electrical insulating cover located on the annular copper conductor.

FIG. 2 is an end view of a composite metal tracer wire 112 typically being used in tracer wire systems. The tracer wire 112 includes a steel core 115 for enhanced strength with an annular copper conductor 114 for enhanced electrically conductive. Steel core 115 is shown as composed of multiple strands; however, if desired it could be a solid core. On the outside of annular copper conductor 114 is an annular electrical insulating cover 113 to electrically isolate the tracer wire from the surrounding soil. Other types of tracer wires used are copper wires. Although the tracer wire connector 90 is shown in use with electrically insulated wire connectors the tracer wire connector 90 can also be used with bare tracer wires. In this type of use of tracer wires it is the junction between the connected wires that would be covered to prevent corrosion therebetween.

Figure 3:
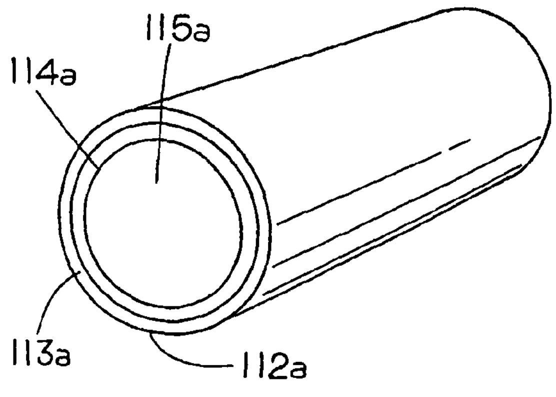
FIG. 3 is an end view of a tracer wire having a steel core with an annular copper conductor on the core and an electrical insulating cover located on the annular copper conductor.

FIG. 3 shows an alternate embodiment of a metal tracer wire 112*a* that includes a one strand steel core 115*a* for enhanced strength with an annular copper conductor 114*a* for enhanced electrically conductive. On the outside of annular copper conductor 114*a* is an annular electrical insulating cover 113*a* to electrically isolate the tracer wire from the surrounding soil.

Figure 4:
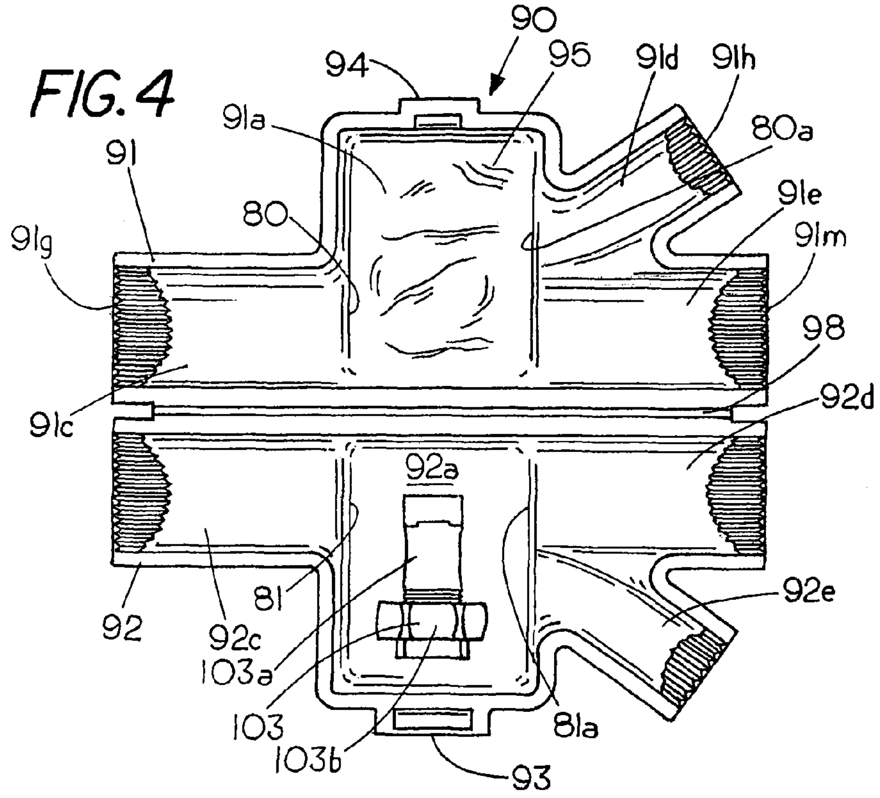
FIG. 4 is a front view of a direct bury tracer wire connector kit with a foldable pod housing.

FIG. 4 shows an open view of a side foldable direct bury branch tracer wire connector kit 90 for use in connecting tracer wires. The tracer wire connector kit 90 includes a first pod 91 having a first tracer wire channel 91*c* extending inward from an end 91*g* to a centrally located tracer wire connector chamber 91*a*. A second tracer wire channel 91*d* having an end 91*h* and a third tracer wire channel 91*e* having an end 91*m* are located opposite end 91*g* with both tracer wire channels 91*e* and 92*e* extending inward to wire connector chamber 91*a* so that each of the tracer wire channels 91*g*, 91*e* and 91*d* terminate in wire connector chamber 91*a*. A tracer wire connector 103 comprising a split bolt connector is located in a chamber 92*a* of pod 92 and a sealant 95 is located in chamber 91*a* of pod 91. A shoulder 80 is located at one side of chamber 91*a* and a second shoulder 80*a* is located on the opposite side of chamber 91*a*. Shoulder 80 and shoulder 80*a* form a stop to limit axial displacement of a tracer wire connector located in chamber 91*a*.

Similarly, a second pod 92 having a first wire channel 92*c* on one end and on the opposite end a second wire channel 92*d* and a third wire channel 92*e* that branch out from a wire connector chamber 92*a*, which is located therebetween and in communication with tracer wire channels 92*d* and 92*e*. In the example shown a hinge 98 such as a living hinge connects the two pods 91 and 92 to each other to enable the two pods to be folded together to form a pod shell. A shoulder 81 is located at one side of chamber 92*a* and a second shoulder 81*a* is located on the opposite side of chamber 92*a*. Shoulder 81 and shoulder 81*a* form a stop to limit displacement of a tracer wire connector located in chamber 92*a*.

Located on one side of pod 92 is a latch comprising a closure 93 that mates with a closure 94 on the opposite side of pod 91 to maintain the pods 91 and 92 in a closed condition when the two pods 91 and 92 are brought into an encapsulating condition by folding pod 91 toward pod 92 or vice versa to produce a pod shell with at least two open ends for extending tracer wires therein. Preferably the closures are integral to the pods and may be closures that frictional engage each other or hook type closures or the like.

In the embodiments shown in FIG. 4 the tracer wire connector kit 90 includes a removable split bolt connector 103 that is located in chamber 92*a*. That is, split bolt connector 103 can be carried in the chamber 92*a* and removed from the chamber when one needs to join a pair of tracer wires together which allows securement of the tracer wires to each other without hindrance from pod 91 or pod 92. In other examples the split bolt connector may be stored separate from the pods and inserted into the pods after the tracer wires have been connected. In some cases one may want the tracer wire connector to be secured directly to the pod so that the tracer wires can be joined to each other without having to remove the tracer wire connector from the tracer wire connector kit 90. In addition, if desired the split bolt connector may be tethered to the pod 92 but removable from the chamber to allow formation of the junction of tracer wires outside the chamber 92*a*. Split bolt connector 103 includes a shank 103*a* having an open u-shaped slot for receiving two or more tracer wires and a nut 103*b* that can be secured to shank 103*a* to bring the tracer wires in the u-shaped slot in shank 103*a* into electrical contact with each other. Connector 103 is sized so that when the pods 91 and 92 are brought into a mated condition the split bolt connector is encompassed by the chamber 91*a* and 92*a*. While a split bolt connector is shown as the preferred connector other types of connectors may be used as long as the connectors can maintain the wires in electrical connection and can fit within the chambers in the tracer wire connector pods.

Figure 5:
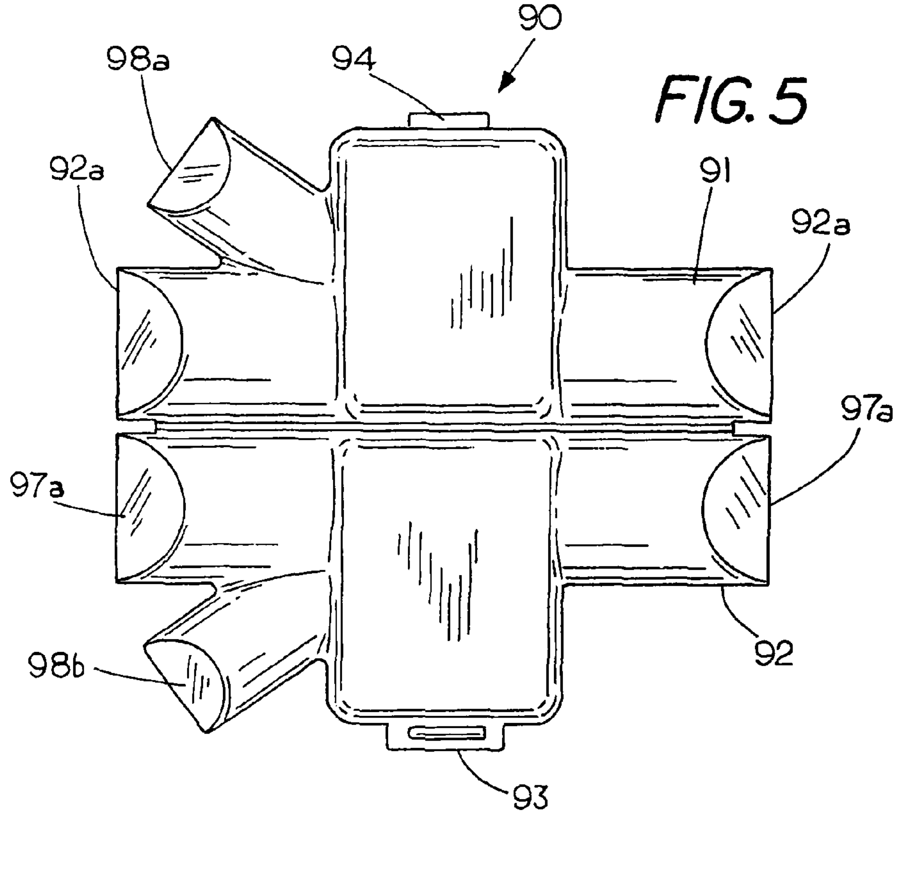
FIG. 5 is a back view of a direct bury tracer wire connector kit of FIG. 4.

FIG. 5 is a backside view of direct bury tracer wire connector kit 90 in the open condition showing the tapered end faces on each of the ends of the pods 91 and 92. That is a tapered end face 92*a* is located on each end of the pod 91 and a tapered end face 97*a* is located on each end of pod 92. In addition, a branch end face 98*a* is located on the branch end of pod 91 and a branch end face 98*b* is located on the end. The end faces angle toward the end of the pod and form a yieldable closure around the tracer wire therein when the two pods 91 and 92 are brought together. To allow yielding of the end face for a wire to pass therethrough the end face can be axially split or partially removed to allow portions of the end face to flex outward and provide space for passage of a wire therethrough.

Figure 6:
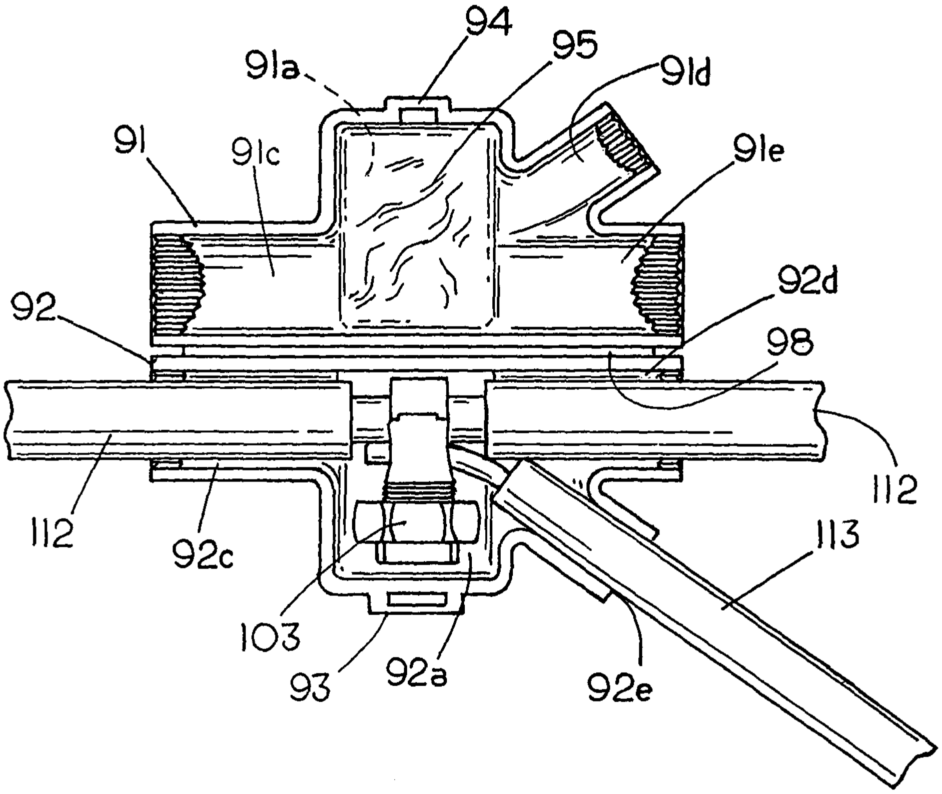
FIG. 6 is a front view of a direct bury tracer wire connector of FIG. 4 having a split bolt connector securing tracer wires to each other.

FIG. 6 shows the side foldable direct bury wire connector kit 90 in a pre closing condition. Pods 91 and 92 are in an open condition having a tracer wire connector 103 with joined tracer wires 112 and 113 located in pod 92. Tracer wire 112 is located in wire channel 92*c* and wire channel 92*d* and tracer wire 113 is located in wire 92*e* with tracer wire 112 joined to tracer wire 113 through split bolt connector 103. As can be seen in FIG. 6 the encapsulating sealant 95 is located in chamber 91*a* in pod 91 and the split bolt connector 103 is located in chamber 92*a* in pod 92. In this embodiment sufficient sealant 95 is maintained in chamber 91*a* so that when the pod 91 and 92 are mated to each other the sealant flows around the split bolt connector 103 and into wire channels 91*c*, 91*d*, 91*e* in pod 91 and wire channels 92*c*, 92*d* and 92*e* in pod 92 to encapsulate the split bolt connector and the exposed portions of the electrical wire conductors 112 and 1113. A hinge 98 such as a living hinge connects the two pods 91 and 92 to each other. The use of the living hinge allows both pods 91 and 92 to be molded from the same material as well as provides a self-alignment of the pods 91 and 92 as the pods are mated to each other. Located on one side of pod 92 is a closure 93 that mates with closure 94 on the pod 91 so that when the two pods 91 and 92 are brought into an encapsulating condition the pods can be secured to each other to maintain the pods in a closed condition.

Figure 6A:
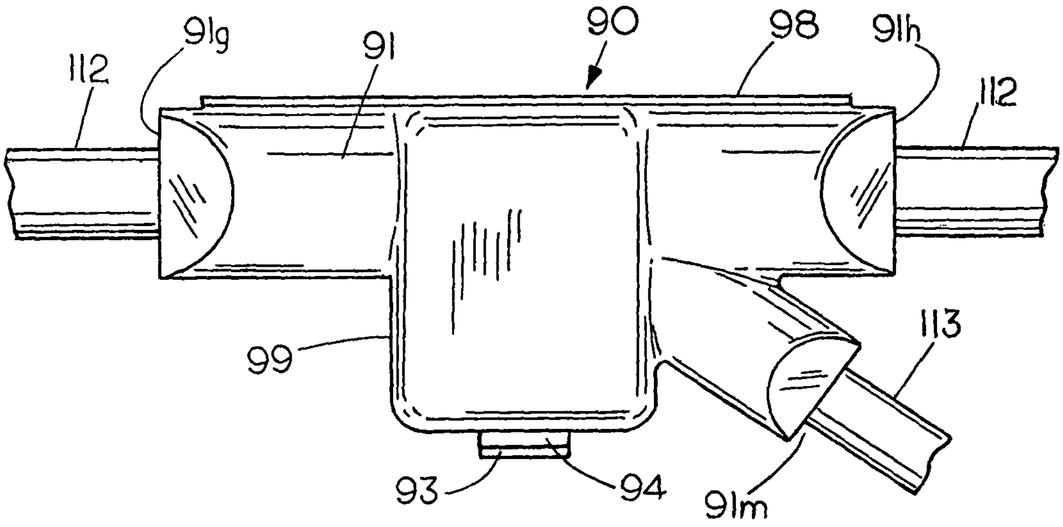
FIG. 6A shows the tracer wire connector kit of FIG. 4 wherein the pods are formed into a pod shell encapsulating a tracer wire junction and a tracer wire connector.

FIG. 6A shows the tracer wire connector kit 90 of FIG. 6 with pod 91 and pod 92 in a closed condition to form a pod shell 99 about a junction between tracer wire 112 and tracer wire 113. In this condition the closures 93 and 94 hold the mating pods in the pod shell with wire 112 extending from end 91*h* on one side of the pod shell 99 and end 91*g* on the opposite side of the pod shell. A branch wire 113 extends from end 91*m* on the pod shell. As can be seen the tracer wire connector pod 91 and 92 may be mirror images of each other.

In addition the wire connector chamber of the tracer wire connector has a greater width than the width of the wire channels extending therefrom to thereby form a shoulder to inhibit displacement of the tracer wire connector therein. Although a shoulder is shown the use of other means to inhibit the tracer wire connector from being displaced from the pods may be used.

Referring to FIG. 1 and FIG. 6 the invention also includes a method of forming an underground detectable system when the system is constructed from virtually undetectable materials comprising the steps of placing an underground system 111 of virtually undetectable materials underground, extending a tracer wire 112, 113 along the length of the system to enable indirect detection of the underground system, connecting the at least two different tracer wires 112, 113 to each other with a tracer wire connector 103 in the absence of a protective housing, placing a first pod 91 and a second pod 92 proximate the tracer wire electrical connector 103 and closing the first and second pod 91, 92 to bring the first pod and the second pod into an encapsulating condition around tracer wire connector (FIG. 6A) while bringing the sealant into a waterproof sealed condition around the tracer wire connector. As can be seen in FIG. 6A the first pod and the second pod may be folded together through a living hinge 98 and one may secure the first pod to the second pod to maintain the first pod and the second pod in a closed condition around the tracer wire connector with integral closures or with separate fasteners. The method may further include the step of forming a tracer wire branching system wherein the step of extending a tracer wire comprises extending a steel core, copper encapsulated along the underground piping system. The method may further include the step of placing a tracer wire connector in a chamber formed by the first pod and the second pod with the tracer wire connector small enough to fit in the chamber formed by the first pod and the second pod but large enough so as to engage a shoulder in the first pod or the second pod to limit displacement of the tracer wire connector from the first pod or the second pod.

In a further aspect the invention as shown in FIG. 1, FIG. 4 and FIG. 6A the invention comprises an underground system for detecting the presence of underground pipe lines comprising an underground pipe 111 virtually undetectable with traditional underground detectors, a first tracer wire 112 and a second tracer wire 113 proximate the underground pipe, a tracer wire connector 90 connecting the first tracer wire 112 to a second tracer wire 113; and a pod 91 from a tracer wire connector kit pod 90 carrying a sealant 91*a* with the pod having a tracer wire connector chamber 91*a* therein with the tracer wire connector encapsulated therein (FIG. 6A) and maintained in the wire connector chamber by the tracer wire connector pod 91 with the first tracer wire 112 and the second tracer wire 113 proximate the underground pipe. The pod may include a shoulder to limit displacement of the tracer wire connector 103 therein.

Figure 7:
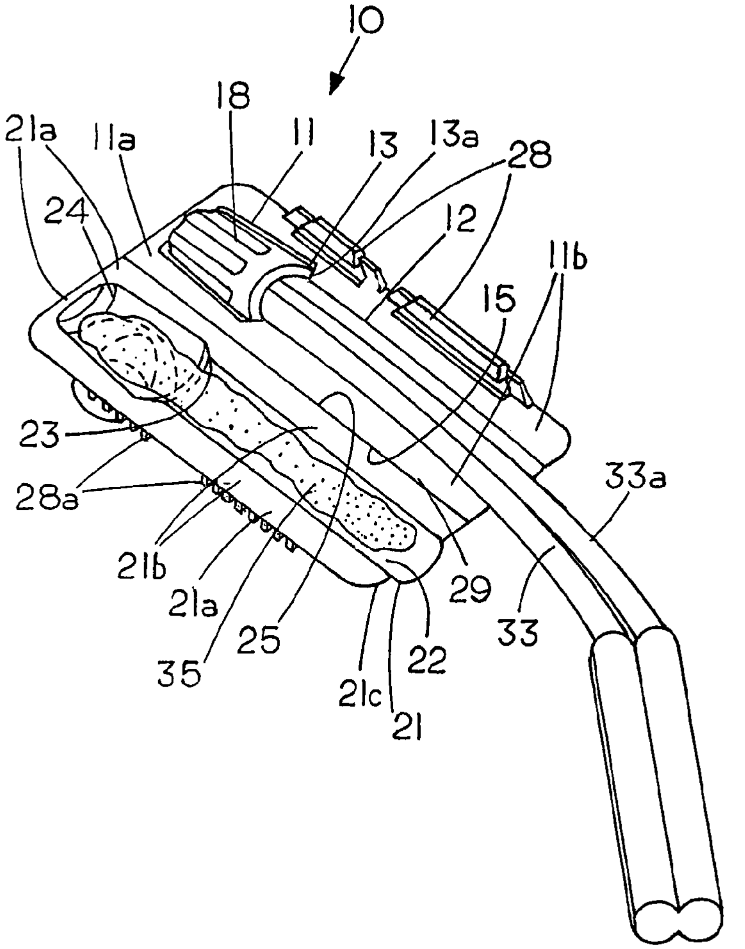
FIG. 7 is another example of a direct bury tracer wire connector kit in an open condition.
Figure 8:
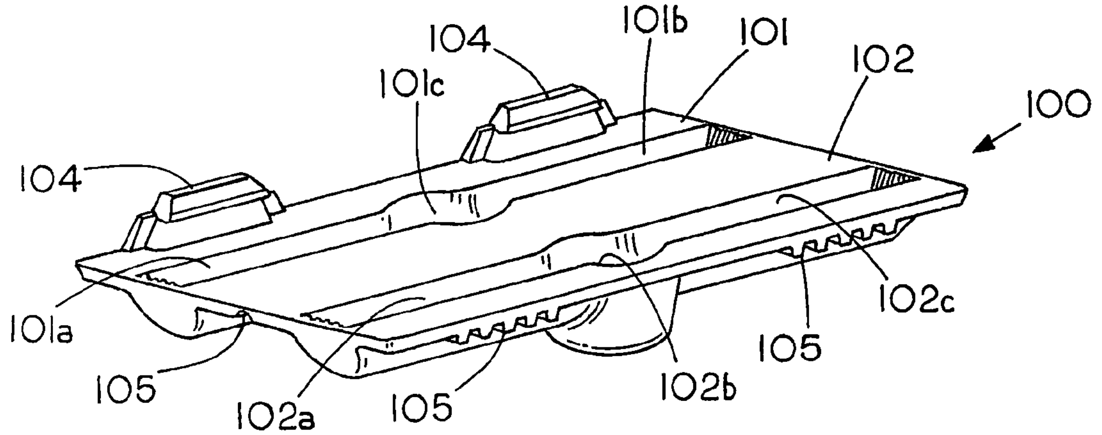
FIG. 8 is an example of another direct bury tracer wire connector kit in an open condition.
Figure 9:
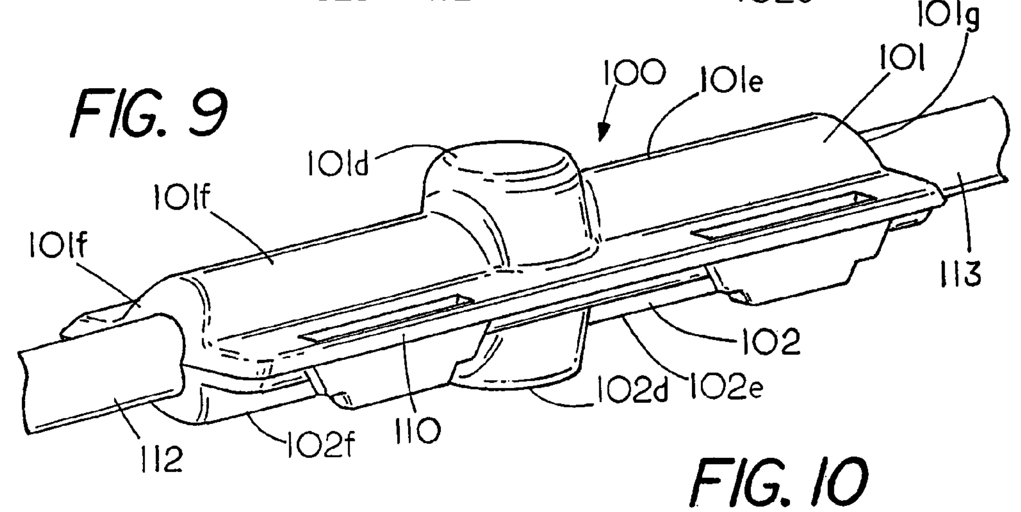
FIG. 9 shows the direct bury tracer wire connector kit of FIG. 8 in a closed condition forming a pod shell.
Figure 10:
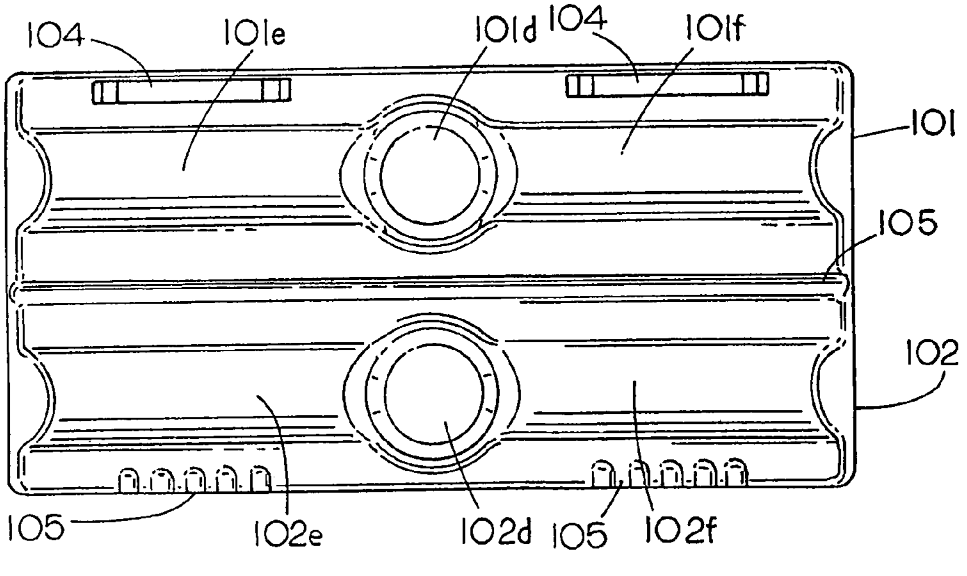
FIG. 10 is a back view of the direct bury tracer wire connector of FIG. 8 in an open condition.

While FIG. 4 to FIG. 6A illustrate an example of a tracer wire connector kit 90 for forming a branch connection to an existing tracer wire in some instances two tracer wires may be connected to each other without a branch wire. FIG. 7 to FIG. 10 are examples of tracer wire connector kits that can be used to join two or more wires in an end to end arrangement. The tracer wire connector of FIG. 7 is an example of a tracer wire connector kit where the wires can be extended parallel to each other from the junction between the tracer wires, while FIGS. 8-10 show an example of a tracer wire connector kit where two or more tracer wires are connected in an end to end condition where the tracer wires extend in opposite directions from the junction FIG. 7 shows a first foldable direct bury tracer wire connector kit 10 in an open condition with tracer wires 33 and 33*a* having ends joined by a twist on wire connector 18. The direct bury tracer wire connector kit 10 includes a first elongated pod 21 having an interrupted U-shaped peripheral wing 21*a* that extends laterally outward from three sides of pod 21. Wing 21*a* includes a flat mateable face 21*b*. Located in pod 21 is a first elongated wire channel 22, a first wire connector chamber 24 and a shoulder 23 that connects wire connector chamber 22 to wire connector chamber 24. wire channel 22 extends inward from an end 21*c* of the first pod 21 and terminates in wire connector chamber 24. A sealant 35 is located in channel 22 and in wire connector chamber 24.

A living hinge 29 hingedly connects one edge 15 of a wing 11*a* of pod 11 to one edge 25 of a wing 21*a* of pod 21 to enable the folding closure of the pod 11 and 21 around a wire connection. That is the hinge 29 functions to guide the pods 11 and 21 into a mating engagement so as to mate the wire channels and chambers in each of the pods with each other.

U-shaped wing 11*a* includes a U-shaped flat mateable face 11*b* that extends around three sides of pod 11. Located in pod 11 is a first elongated wire channel 12 having wires 33 therein, a first wire connector chamber 13 having a wire connector 18 therein and a shoulder 13*a* that connects wire connector chamber 12 to wire connector chamber 30. wire channel 12 extends inward from an end 11*c* of the first pod 11 and terminates in wire connector chamber 13. A latch 28 on pod 11 allows one to latch pod 11 to pod 21 to form an enclosure around a wire connector.

Similarly, second pod 21 has a second wire channel 22, a second wire connector chamber 24 and a second shoulder 23 that connects wire connector chamber 24 to wire channel 22. In the embodiment shown a set of wires 33 are shown connected together with the tracer wire connector comprising a twist-on wire connector 18. The wire connector 18 and the wires 33 are shown in wire channel 12 and wire connector chamber 30 with both the wire connector 18 and the wires 33 extending above the face 11*b* of the pod 11.

While the wire channel 12 and the wire connector chamber 13 can be sufficiently small so as not to encapsulate the wire connector 18 and the wires 33 therein the wire connector chamber 24 and the wire channel 22 of pod 21 can cooperate with the wire channel 12 and the wire connector chamber 13 of pod 11 so that when the first pod 11 and the second pod 21 are folded together in a face to face relationship the wire channel 12 and the wire channel 22 form an enclosure large enough for the wires 33. Similarly, the wire connector chamber 13 and the wire connector chamber 24 cooperate to form a wire connector chamber that is large enough to hold the wire connector when the first pod 11 is folded into a face to face relationship with the second pod 21. The use of the connector 40 is particularly well suited for underground use where it is important that the splices be kept waterproof.

Thus one example of the invention includes a direct bury tracer wire connector kit for an underground electrical connection comprising a pod having an interrupted peripheral wing with a mateable face with the pod having a wire channel located therein with the wire channel extending inward from an end of the pod and terminating in a wire connector chamber. A second pod, which can be a plane member or a domed member identical or similar to the first pod, can be used for forming a pod shell. When the first pod and the second pod are brought into engagement in the presence of a sealant the first pod and the second pod form a pod shell around a wire connector and the sealant forms an in situ sealant encapsulation of a wire connector and tracer wire leads extending therefrom. A closure member can be used to hold the two pods in mating engagement.

The second pod may comprises a flat member if the wire channel in the first pod is formed sufficiently large to encapsulate the tracer wire connector with the sealant therein when the second pod is joined to the first pod. While the first pod and the second pod need not be hinged to each other but hinging to each other can permit quick folding and alignment of the pods in order to bring the pods into an encapsulating condition around a tracer wire connector.

Thus the invention includes a pod shell for having a tracer wire connector therein wherein a pod has a wire channel located therein with the channel extending inward from an end of the pod; a cover for forming an enclosure with the pod where the cover may be a second pod; and a sealant located in the channel so that when the pod and the cover are brought into engagement the pod and the cover form an enclosure around a tracer wire connector and the sealant forms an in situ sealant encapsulation of the tracer wire connector and the electrical leads extending therefrom. If the cover and the pod are hinged together the closing of the cover on the pod simultaneously forms the in situ encapsulation.

FIG. 8 is a perspective view of a side foldable direct bury tracer wire connector kit 100 for connecting tracer wires in an end to end condition with the tracer wires extending outward in different directions. FIG. 8 shows the tracer wore connector kit in the open condition and FIG. 9 shows the tracer wire connector kit 100 in the closed condition and FIG. 8A is a top view of the tracer wire connector kit 100 in an open condition and FIG. 10 is a back view of the side foldable direct bury tracer wire connector kit 100 in a closed condition.

In the perspective view of FIG. 9 the side foldable direct bury tracer wire connector kit 100 where pod 101 and pod 102 have been folded together to form a pod shell 110 having a tracer wire 112 that extends from one end 101*f* of pod shell 110 and a second tracer wire 113 that extends from an opposite end 101*g* of pod shell 110. In the example of FIGS. 8-10 a tracer wire connector is encapsulated in pod shell 110 with the tracer wire 112 and tracer wire 113 spliced to each other through the tracer wire connector.

Figure 8A:
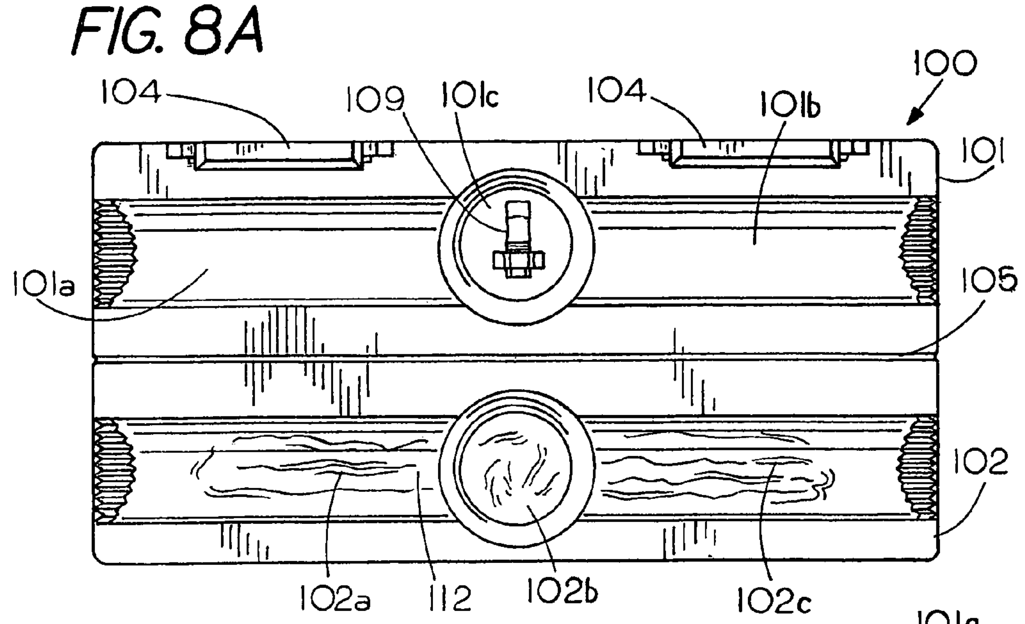
FIG. 8A shows the direct bury tracer wire connector kit of FIG. 8 in a top view.

FIG. 8A shows a top view of the foldable tracer wire connector kit 100 in the open condition. Tracer wire connector kit 100 includes a first pod 100 having a first open top tracer wire connector chamber 101*c*, containing a split bolt connector 109 and a first elongated tracer wire channel 101*a* extending from one side of chamber 101*c* and a second elongated tracer wire channel 101*b* extending from an opposite side of the tracer wire connector chamber 101*c*. A second pod 102, which is mateable with the first pod 101, is connected thereto by a hinge 105. Pod 102 includes a first open top chamber 102*b*, and an elongated tracer wire channel 102*c* extending from one side of the first chamber 102*b* and a further elongated tracer wire channel 102*c* extending from an opposite side of wire connector chamber 102*b*. A sealant 112 is located in the chamber 102*b* and channels 102*a* and 102*c*. Sufficient sealant 112 is placed in pod 112 so that when either the first pod 101 or the second pod 102 are folded together it brings the tracer wire connector 109 into an encapsulating condition around the exposed ends of tracer wires secured to each other in the tracer wire connector 109. That is, the side foldable tracer wire connector kit 100 allows one to first form the electrical connection between two or more tracer wires and then after the electrical connection is formed the electrical connection can be covered and sealed by merely folding the pod 101 and 102 together.

In each of the examples of the afore described tracer wire connector kits a latch or closure are included for holding the pods together when the two pods are brought into face-to-face engagement with each other. As an alternate example the latch may be eliminated. In such cases one can secure the pods to each other through separate fasteners including but not limited to fasteners such as clips, sleeves, electrical tape or the like. With the use of electrical tape the tape may be wound around the mated pods to not only secure the pods in a closed condition but also provide additional skin or covering to the pod shell formed by the two pods. Any of variety of sealants may be used in the pod, preferably the sealant is sufficiently viscous so as to remain in position in the pod as the pods as the pods are transported or are brought into a mateable condition. Examples of such sealants are silicone and silicone gels all though other waterproof sealants may be used without departing from the spirit and scope of the present invention. While the tracer wire connector kits are shown with the sealant in the chamber in certain circumstances one may want to apply the sealant to the chamber in the field. Each of the pods are preferably made of a single material, such as an electrical insulating material, to provide a one piece integral tracer wire connector pod shell which can be molded in a single operation. Although if desired one may make the pods as separate components and then assemble the components around a tracer wire connector. Polymer plastics which can withstand conditions of an underground environment such as polyethylene, PVC or the like are suitable materials that may be used as the pods to form the pod shell.

Thus in one aspect the invention comprise a tracer wire connector kit comprising: a tracer wire connector for securing at least two wires in electrical contact with each other; a first pod having a wire connector chamber and a wire channel extending from the wire connector chamber; and a second pod mateable with the first pod, the second pod forming a cover for the wire connector chamber of the first pod and the wire channel of the first pod to enable the tracer wire connector to be encapsulated with a sealant contained in the wire connector chamber as the first pod and the second pod are brought into a mating condition around the tracer wire connector having an electrically junction of at least two tracer wires therein.

We claim:

1. An underground system for detecting the presence of underground pipe lines comprising:

an underground pipe virtually undetectable with traditional underground detectors;

a first tracer wire and a second tracer wire proximate the underground pipe;

a tracer wire connector connecting said first tracer wire to said second tracer wire; and a pod from a tracer wire connector kit carrying a sealant with said pod having a tracer wire connector chamber therein and said pod having a first shoulder located in the tracer wire connector chamber, said first shoulder extending transversely from side to side of a first wire channel to form a transverse stop to restrain the tracer wire connector from being dislodged from the tracer wire connector chamber and a second shoulder located in the tracer wire connector chamber, said second shoulder joining an opposite side of said wire connector chamber to said first wire channel with said second shoulder extending transversely from side to side of a second wire channel to form a further transverse stop to restrain the tracer wire connector therein from being dislodged from an opposite side of said chamber, said pod having said first wire channel extending outward from said first shoulder and said second wire channel extending outward from said second shoulder with the tracer wire connector encapsulated therein and maintained in said chamber by said tracer wire connector pod with the first tracer wire and the second tracer wire proximate the underground pipe.

2. The underground system of claim 1 including a sealant located around said tracer wire connector and said pod having a third wire channel extending outward from said second shoulder.

3. The method of forming an underground detectable system when the system is constructed from virtually undetectable materials comprising;

placing an underground system of virtually undetectable materials underground;

extending a tracer wire along the length of the system to enable indirect detection of the underground system;

connecting the at least two different tracer wires to each other with a tracer wire connector in the absence of a protective housing;

placing a first pod and a second pod proximate the tracer wire electrical connector;

closing the first pod and the second pod to bring the first pod and the second pod into an encapsulating condition around the tracer wire connector by engaging a first shoulder located inside the first pod extending transversely from side to side of a first wire channel extending outward from the first shoulder and forming a transverse stop for restraining the tracer wire connector therein from being dislodged from a first side of a chamber and a second shoulder located inside the first pod joining an opposite side of a wire connector chamber to said wire channel with said second shoulder extending transversely from side to side of a second wire channel extending outward from the second shoulder thereby forming a further transverse stop for restraining the tracer wire electrical connector therein from being dislodged from an opposite side of said chamber while bringing a sealant into a waterproof sealed condition around the tracer wire connector.

4. The method of claim 3 including the step of folding the first pod to the second pod through a living hinge.

5. The method of claim 4 including the step of securing the first pod to the second pod to maintain the first pod and the second pod in a closed condition around the tracer wire connector.

6. The method of claim 5 including the step of forming a tracer wire branching system wherein the step of extending a tracer wire comprises extending a steel core, copper encapsulated tracer wire along the underground system.

7. The method of claim 6 including the step of placing a tracer wire connector in a chamber formed by the first pod and the second pod with the tracer wire connector small enough to fit in the chamber formed by the first pod and the second pod but large enough so as to engage the first shoulder in the first pod with the second shoulder in the first pod and to engage the first shoulder in the second pod with the second shoulder in the second pod to limit displacement of the tracer wire connector from the first pod or the second pod.

* * * * *